United States Patent
Ehyaie et al.

(10) Patent No.: US 9,026,060 B2
(45) Date of Patent: May 5, 2015

(54) BIDIRECTIONAL MATCHING NETWORK

(71) Applicant: QUALCOMM Incorporated, San Diego, CA (US)

(72) Inventors: Danial Ehyaie, San Francisco, CA (US); Mazhareddin Taghivand, Campbell, CA (US)

(73) Assignee: QUALCOMM Incorporated, San Diego, CA (US)

( * ) Notice: Subject to any disclaimer, the term of this patent is extended or adjusted under 35 U.S.C. 154(b) by 195 days.

(21) Appl. No.: 13/691,361

(22) Filed: Nov. 30, 2012

(65) Prior Publication Data

US 2014/0152385 A1    Jun. 5, 2014

(51) Int. Cl.
*H04B 1/38* (2006.01)
*H03F 1/56* (2006.01)
*H04B 1/18* (2006.01)

(52) U.S. Cl.
CPC ................ *H03F 1/56* (2013.01); *H03F 1/565* (2013.01); *H04B 1/18* (2013.01)

(58) Field of Classification Search
USPC ........... 455/73, 84, 107, 194.2; 330/124, 126, 330/144
See application file for complete search history.

(56) References Cited

U.S. PATENT DOCUMENTS

| | | | |
|---|---|---|---|
| 6,130,589 A | 10/2000 | Yamaguchi et al. | |
| 7,283,793 B1 | 10/2007 | McKay | |
| 7,307,494 B2 | 12/2007 | Erb | |
| 7,486,134 B2 * | 2/2009 | Chang et al. | 330/51 |
| 7,620,376 B2 * | 11/2009 | Vaisanen | 455/107 |
| 7,839,229 B2 | 11/2010 | Nakamura et al. | |
| 8,170,505 B2 | 5/2012 | Keerti et al. | |
| 2003/0112094 A1 | 6/2003 | Ehara et al. | |
| 2004/0127178 A1 | 7/2004 | Kuffner | |
| 2004/0251987 A1 | 12/2004 | Nakamura et al. | |
| 2007/0099583 A1 | 5/2007 | Vaisanen et al. | |
| 2007/0142014 A1 | 6/2007 | Wilcox et al. | |
| 2009/0195317 A1 | 8/2009 | Zhang et al. | |
| 2010/0321129 A1 | 12/2010 | Onody et al. | |
| 2011/0143690 A1 | 6/2011 | Jerng et al. | |

FOREIGN PATENT DOCUMENTS

WO    2007104055 A2    9/2007

OTHER PUBLICATIONS

International Search Report and Written Opinion—PCT/US2013/072305—ISA/EPO—Dec. 17, 2014.

* cited by examiner

*Primary Examiner* — Tuan H Nguyen
(74) *Attorney, Agent, or Firm* — Ramin Mobarhan

(57) ABSTRACT

A bidirectional matching network is disclosed. In an exemplary embodiment, an apparatus includes a first matching circuit connected in a first signal path between a node and a first amplifier, the first matching circuit configured to translate an off-state impedance of the first amplifier to a first translated off-state impedance. The apparatus also includes a second matching circuit connected in a second signal path between the node and a second amplifier. The second matching circuit configured to translate an off-state impedance of the second amplifier to a second translated off-state impedance. The second translated off-state impedance is configured to reduce power loss associated with a first signal flowing in the first signal path and the first translated off-state impedance is configured to reduce power loss associated with a second signal flowing in the second signal path.

20 Claims, 7 Drawing Sheets

BIDIRECTIONAL MATCHING NETWORK

BACKGROUND

1. Field

The present application relates generally to the operation and design of analog front ends, and more particularly, to the operation and design of matching networks for use in analog front ends.

2. Background

Beamforming transceivers having multiple antennas are typically utilized to transmit and receive signals over wireless links operating at millimeter (MM) wavelengths, for instance to transmit and receive signals at 60 GHz. Almost all of the beamforming transceivers require phase shifters and a power divider/combiner network. It would be desirable to share connections to the antenna, the phase shifter, and power divider/combiner network for both transmit and receive functions. However, to do that typically requires the use of switches that can be actuated to redirect transmit and receive signals. Unfortunately, switches have large insertion loss that results in less efficient transceiver operation.

Accordingly, what is needed is a way to avoid the insertion loss associated with switches used in analog front ends.

BRIEF DESCRIPTION OF THE DRAWINGS

The foregoing aspects described herein will become more readily apparent by reference to the following description when taken in conjunction with the accompanying drawings wherein.

DETAILED DESCRIPTION

The detailed description set forth below in connection with the appended drawings is intended as a description of exemplary embodiments of the invention and is not intended to represent the only embodiments in which the invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
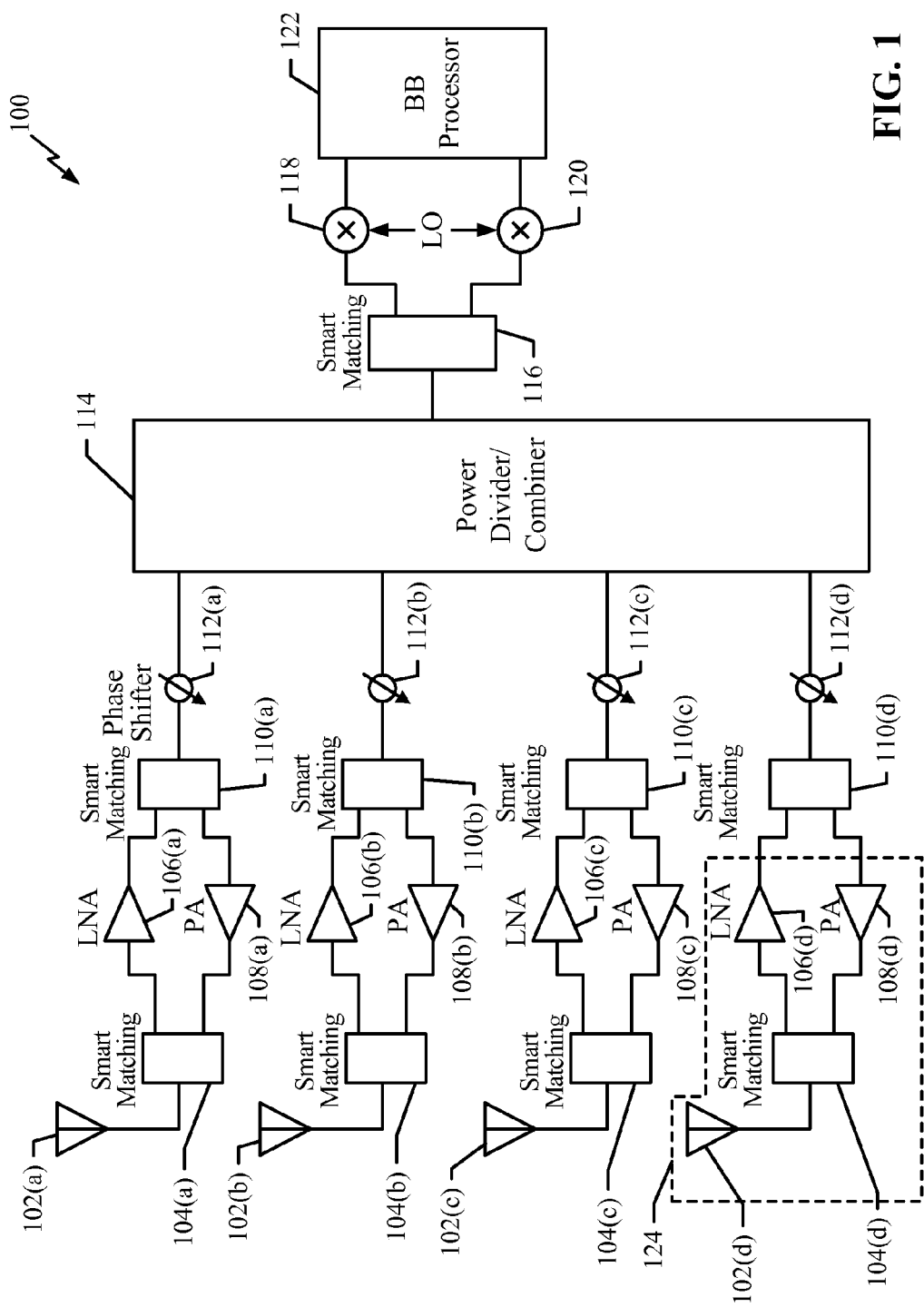
FIG. 1 shows an exemplary embodiment of MM wave beamforming transceiver.

FIG. 1 shows an exemplary embodiment of MM wave beamforming transceiver 100. The transceiver 100 comprises a plurality of antennas 102(a-d) that are connected to smart matching networks 104(a-d), respectively. The matching networks 104(a-d) match the antennas 102(a-d) to receiving LNAs 106(a-d) and to transmitting power amplifiers (PA) 108(a-d), respectively. The LNAs 106 and PAs 108 are further connected to smart matching networks 110(a-d), which operate to match the LNAs 106 and PAs 108 to phase shifters 112(a-d). The phase shifters 112 are connected to a power divider/combiner 114 that combines RF signals received from the phase shifters 112 for input to a downconverting mixer 118. The power divider/combiner 114 also divides RF signals to be transmitted that are received from an upconverting mixer 120 and inputs the divided signals to the phase shifters 112. A smart matching network 116 matches the power combiner/divider 114 to downconverter 118 and upconverter 120, which are further coupled to a BB processor 122. Thus, the transceiver 100 is configured to perform beamforming on transmit and receive signals in the MM-wave frequency range.

In exemplary embodiments, the novel smart matching networks 104, 110 and 116 are configured to save area, provide bidirectional operation, and eliminate the need for switches, thereby avoiding insertion loss typically incurred when switches are utilized. The novel smart matching networks 104, 110 and 116 operate at MM wave frequencies, however, the smart matching network are not limited to operation at these frequency ranges such that various embodiments are suitable for use at other frequency ranges. For clarity, the region 124 that includes the matching network 104(d) is described in greater detail below. It should be noted that the novel features and aspects of matching network 104(d) can be extended to other matching networks shown in FIG. 1.

Figure 2:
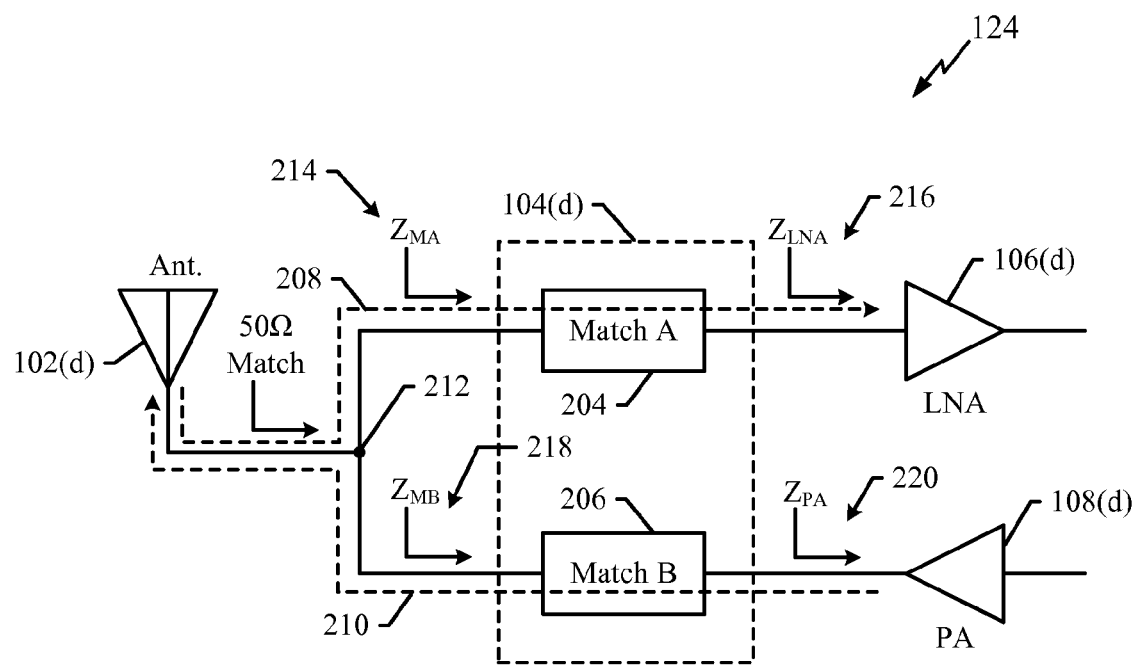
FIG. 2 shows an exemplary detailed embodiment of a smart matching network illustrated in FIG. 1.

FIG. 2 shows an exemplary detailed embodiment of the region 124 illustrated in FIG. 1. The region 124 includes antenna 102(d), matching network 104(d), LNA 106(d), and PA 108(d). The matching network 104(d) comprises a match A circuit 204 and a match B circuit 206.

The matching network 104(d) provides two signal paths; namely a receive signal path 208 and a transmit signal path 210. The matching network 104(d) is configured to provide impedance matching to a device. For example the matching network 104(d) provides impedance matching to the antenna 102(d). In an exemplary embodiment, the matching network 104(d) is configured to provide a matching impedance (i.e., 50 ohms) to the antenna 102(d) as seen at node 212. Thus, the impedances of the receive signal path 208 and the transmit signal path 210 combine to provide the matching impedance seen by the antenna 102(d) at node 212. The match A circuit 204 provides an input impedance of $Z_{MA}$ 214 and sees an impedance of $Z_{LNA}$ 216 with respect to the input of the LNA 106(d). The match B circuit 206 provides an input impedance of $Z_{MB}$ 218 and sees an impedance of $Z_{PA}$ 220 with respect to the output of the PA 108(d).

During operation in a receive mode, the transmit signal path 210 is disabled and the receive signal path 208 is enabled. The PA 108(d) is turned off and as a result, the impedance $Z_{PA}$ 210 becomes $Z_{PA\_off}$, which represent the output impedance of the PA 108(d) when in the off state. During operation in a transmit mode, the receive signal path 208 is disabled and the transmit signal path 210 is enabled. The LNA 106(d) is turned off and the impedance $Z_{LNA}$ 208 becomes $Z_{LNA\_off}$, which represents the input impedance of the LNA 106(d) when in the off state.

In various exemplary embodiments, the match A circuit 204 and the match B circuit 206 are configured to provide two impedances as seen at the node 212. A first impedance is provided when their associated signal branch is enabled. A second impedance is provided when their associated signal branch is disabled. For example, during transmission the received signal path 208 is disabled and the match A circuit 204 is configured to combine with the $Z_{LNA\_off}$ impedance to produce a translated off impedance as seen at the node 212 that reduces or eliminates power loss of signals in the transmit signal path 210. Similarly, during reception the transmit signal branch 210 is disabled and the match B circuit 206 is configured to combine with the $Z_{PA\_off}$ impedance to produce a translated off impedance as seen at the node 212 that reduces or eliminates power loss of signals in the receive signal path 208. A more detailed description of the operation of the smart matching network is provided below.

Figure 3:
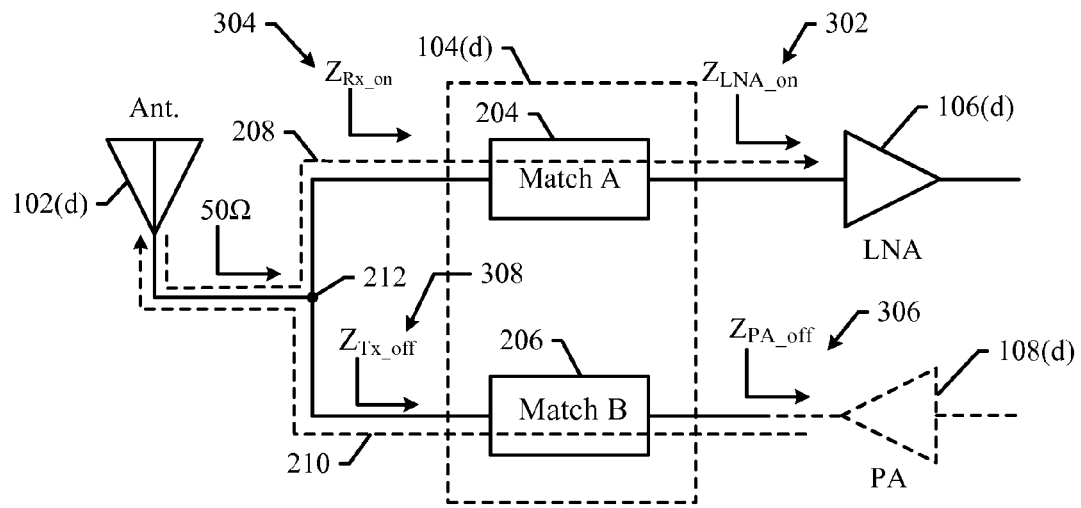
FIG. 3 shows an exemplary embodiment of the smart matching network during operation in a receive mode.

FIG. 3 shows an exemplary embodiment of the smart matching network 104(d) during operation in a receive mode. In this operating mode, the receive signal path 208 is enabled and the transmit signal path 210 is disabled. A received signal flows from the antenna 102(d) to the LNA 106(d) through the receive signal path 208. With the receive signal path 208 enabled, the match A circuit 204 is configured to combine with the on-state impedance ($Z_{LNA\_on}$) 302 seen at the input of the LNA 106(d) and to translate this impedance to generate a first translated on-state impedance ($Z_{Rx\_on}$) 304, which appears at the input of the match A circuit 204.

Furthermore, the PA 108(d) is turned off and so the impedance seen at the output of the PA 108(d) is defined as ($Z_{PA\_off}$) 306. The match B circuit 206 is configured to combine with the $Z_{PA\_off}$ impedance 306 and to translate this impedance to generate a second translated off-state impedance ($Z_{Tx\_off}$) 308 that is seen at the output of the match B circuit 206. The second translated off-state impedance $Z_{Tx\_off}$ 308 associated with the transmit signal path 210 combines with the first translated on-state impedance $Z_{Rx\_on}$ 304 associated with the receive signal path 208 to provide a matching impedance (i.e., 50 ohms) to the antenna 102(d) at the node 212. Also, as described in greater detail below, the second translated off-state impedance $Z_{Tx\_off}$ 308 is configured to reduce or eliminate power loss for signals received by the antenna 102(d) and flowing on the receive signal path 208.

Figure 4:
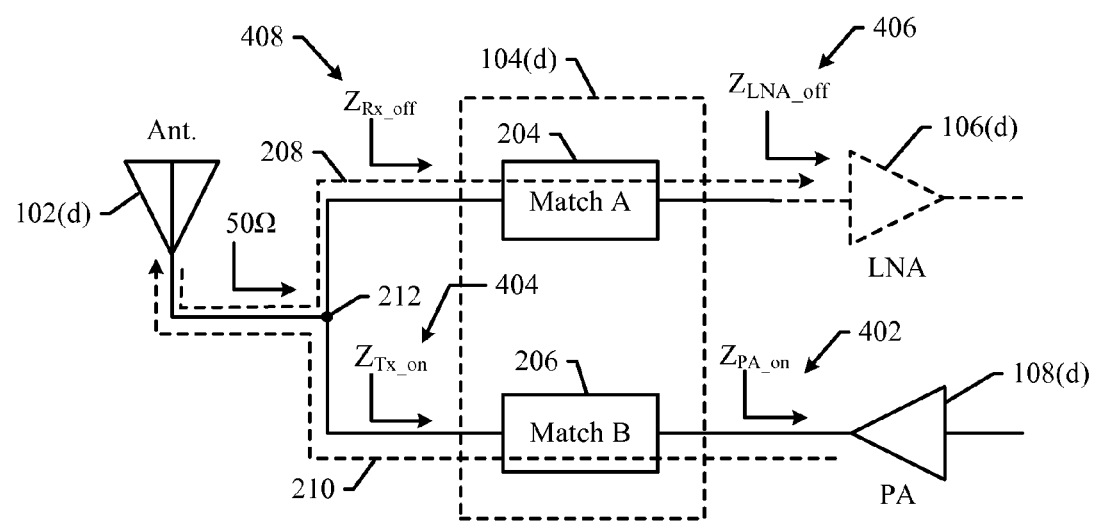
FIG. 4 shows an exemplary embodiment of the smart matching network during operation in a transmit mode.

FIG. 4 shows an exemplary embodiment of the smart matching circuit 104(d) during operation in a transmit mode. In this operating mode, the receive signal path 208 is disable and the transmit signal path 210 is enabled. A transmit signal flows from the PA 108(d) to the antenna 102(d) through the transmit signal path 210. With the transmit signal path 210 enabled, the match B circuit 206 is configured to combine with the on-state impedance ($Z_{PA\_on}$) 402 seen at the output of the PA 108(d) and to translate this impedance to generate a second translated on-state impedance ($Z_{Tx\_on}$) 404, which appears at the output of the match B circuit 206.

Furthermore, the LNA 106(d) is turned off and so the impedance seen at the input of the LNA 106(d) is defined as ($Z_{LNA\_off}$) 406. The match A circuit 204 is configured to combine with the $Z_{LNA\_off}$ impedance 406 and to translate this impedance to generate a first translated off-state impedance ($Z_{Rx\_off}$) 408 that is seen at the input of the match A circuit 204. The first translated off-state impedance $Z_{Rx\_off}$ 408 associated with the receive signal path 208 combines with the second translated on-state impedance $Z_{Tx\_on}$ 404 associated with the transmit signal path 210 to provide a matching impedance (i.e., 50 ohms) to the antenna 102(d) at the node 212. Also, as described in greater detail below, the first translated off-state impedance $Z_{Rx\_off}$ 408 is configured to reduce or eliminate power loss for signals flowing on the transmit signal path 210 for transmission by the antenna 102(d).

Figure 5:
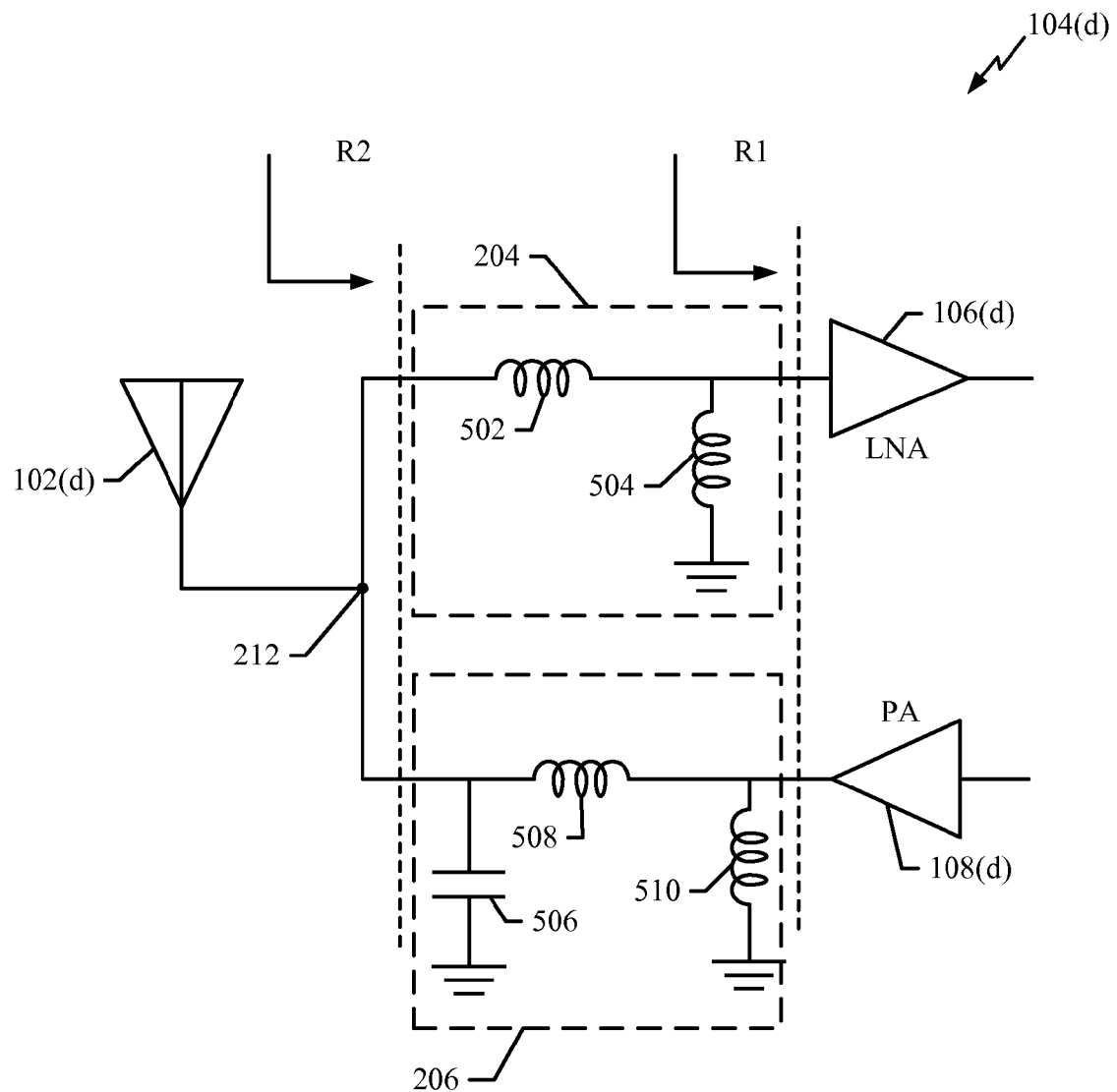
FIG. 5 shows an exemplary embodiment of the smart matching network.

FIG. 5 shows an exemplary embodiment of the smart matching network 104(d). The antenna 102(d) is connected to node 212, which is further connected to the smart matching network 104(d). The match A circuit 204 comprises a first inductor 502 connected between the node 212 and an input of the LNA 106(d). A second inductor 504 is connected between the input of the LNA 106(d) and a ground. The match B circuit 206 comprises a fourth inductor 508 connected between the node 212 and an output of the PA 108(d). A fifth inductor 510 is connected between the output of the PA 108(d) and a ground. A first capacitor is connected between the node 212 and the ground.

Two impedance indicators (R1 and R2) are shown that indicate impedances at two locations in the smart matching network 104(d). The first impedance indicator (R1) indicates impedances at the input to the LNA 106(d) and the output of the PA 108(d). The second impedance indicator (R2) indicates impedances at the input to the matching A circuit 204 and the output of the match B circuit 206. The impedance indicators (R1 and R2) are used below to demonstrate how the smart matching network effectively reduces or eliminates signal power loss attributable to a disabled signal path as well as provide a matching impedance (i.e., 50 ohms) to the antenna 102(d).

Figure 6:
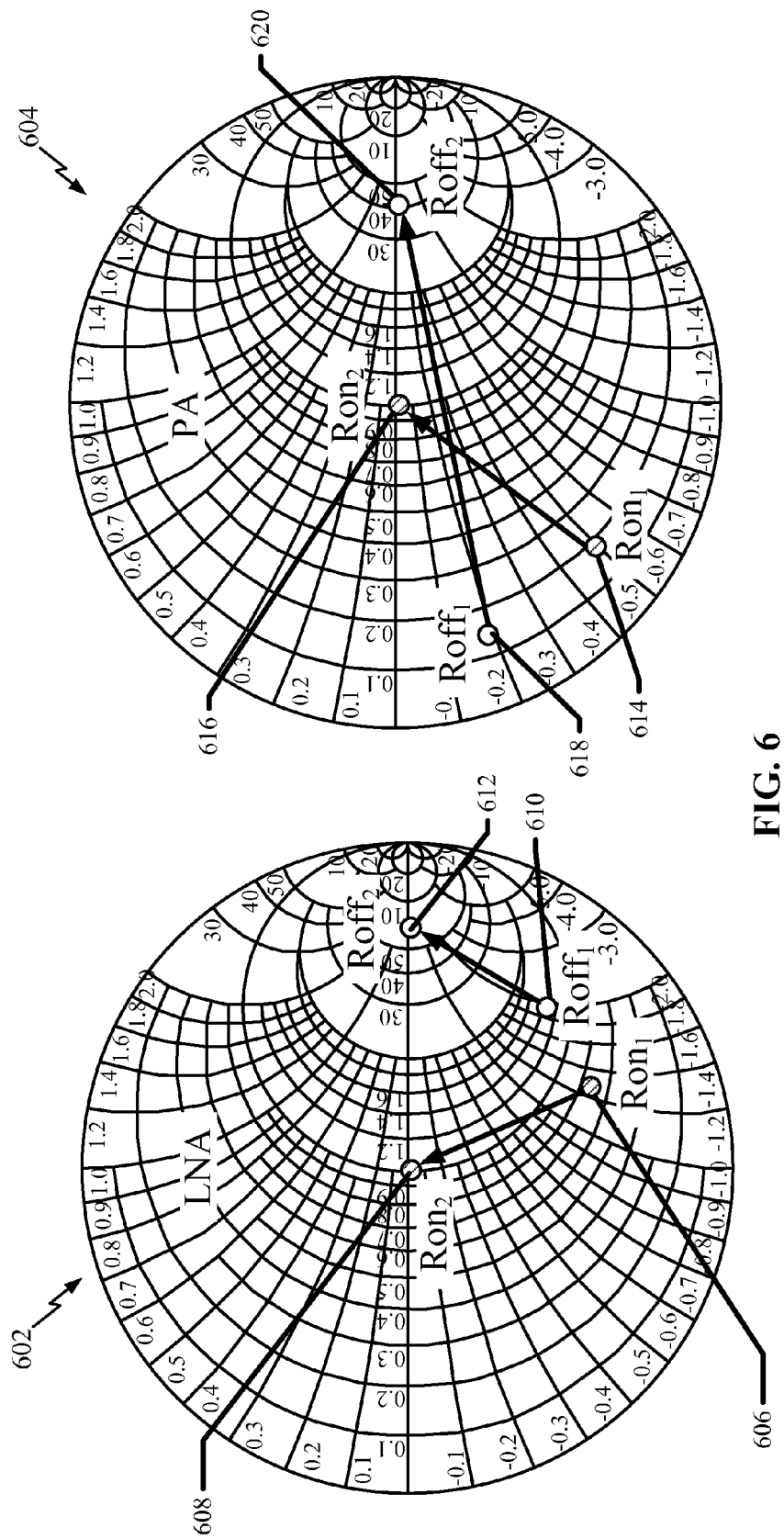
FIG. 6 shows exemplary Smith charts that illustrate the operation of the smart matching network.

FIG. 6 shows exemplary Smith charts 600 that illustrate the operation of the smart matching network 104(d) shown in FIGS. 3-4. For example, the Smith charts 600 illustrate how the match A circuit 204 and the match B circuit 206 operates to provide on-state and off-state impedances that combine to match to the antenna 102(d) while operating to reduce power loss attributable to a disabled signal path.

Referring now to the Smith chart 602, the operation of the match A circuit 204 is illustrated. During operation in a receive mode, the LNA 106(d) is turned on and its on-state input impedance (i.e., $Z_{LNA\_on}$ 302) is shown at ($R_{on1}$) 606. The match A circuit 204 combines with the on-state input impedance of the LNA 106(d) and translates this impedance to generate a first translated on-state impedance (i.e., $Z_{Rx\_on}$ 304) as shown at ($R_{on2}$) 608.

In a transmit mode, the LNA 106(d) is turned off and provides an off-state input impedance (i.e., $Z_{LNA\_off}$ 406) as shown by ($R_{off1}$) 610. The match A circuit 204 combines with the off-state input impedance of the LNA 106(d) and translates this impedance to generate a first translated off-state impedance (i.e., $Z_{LNA\_off}$ 406) shown as ($R_{off2}$) 612. The impedance ($R_{off2}$) 612 is configured to reduce or eliminated power loss associated with a signal that flows in the transmit signal path 210. It should be noted that the values of $R_{on2}$ 608 and $R_{off2}$ 612 shown in the Smith chart 602 are only representative and that the match A circuit 204 can be configured to translate the impedance of the LNA 106(d) to provide any other impedance values.

Referring now to the Smith chart 604, the operation of the match B circuit 206 is illustrated. During operation in a transmit mode, the PA 108(d) is turned on and its output impedance (i.e., $Z_{PA\_on}$ 402) is shown at ($R_{on1}$) 614. The match B circuit 206 combines with this on-state output impedance of the PA 108(d) to provide a second translated on-state impedance (i.e., $Z_{Tx\_on}$ 404) as shown at ($R_{on2}$) 616.

In a receive mode, the PA 108(d) is turned off and provides an off-state output impedance (i.e., $Z_{PA\_off}$ 306) as shown by ($R_{off1}$) 618. The match B circuit 206 combines with the off-state output impedance of the PA 108(d) and translates this impedance to generate a second translated off-state impedance (i.e., $Z_{Tx\_off}$ 308) shown as ($R_{off2}$) 620. The impedance ($R_{off2}$) 620 is configured to reduce or eliminated power loss associated with a signal flowing in the receive signal path 208. It should be noted that the values of $R_{on2}$ 616 and $R_{off2}$ 620 shown in the Smith chart 604 are only representative and that the match B circuit 206 can be configured to translate the impedance of the PA 108(d) to provide any other impedance values.

The impedances provided by the match A circuit 204 and the match B circuit 206 combine to form a matching impedance at the node 212 that matches to the antenna 102(d). For example, during receive mode, the match A circuit provides the first translated on-state impedance ($R_{on2}$ 608) and the match B circuit 206 provides the second translated off-state impedance ($R_{off2}$ 620), which combine to form the matching impedance seen at the node 212. Similarly, during transmission, the match A circuit 204 provides the first translated off-state impedance ($R_{off2}$ 612) and the match B circuit 206 provides the second translated on-state impedance ($R_{on2}$ 616), which combine to form the matching impedance seen at the node 212. Thus, the antenna 102(d) sees a matching impedance at node 212 that is the combination of the translated impedances generated by the match A circuit 204 and match B circuit 206 based on the selected operating mode.

Therefore, in exemplary embodiments, the novel matching network 104(d) provides concurrent matching in a transceiver without the use of switches. The matching network saves area, provides bidirectional operation, and eliminates the need for switches, thereby avoiding the associated insertion loss.

Figure 7:
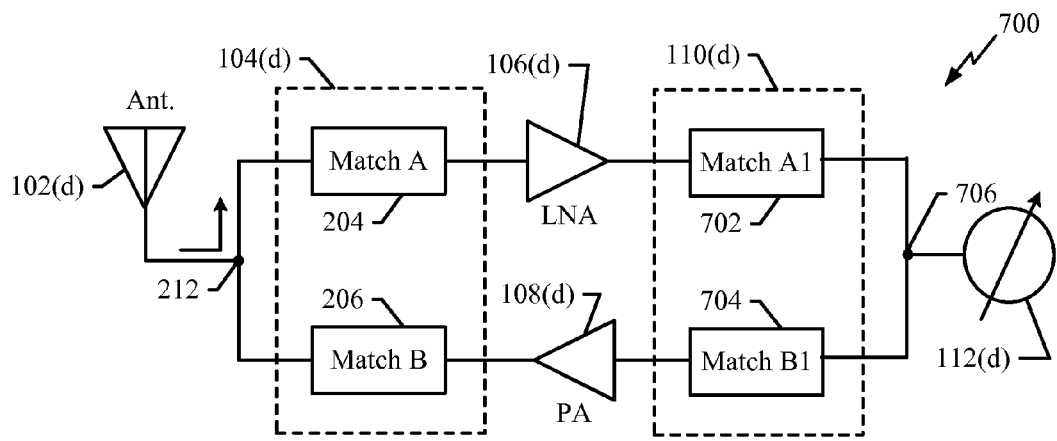
FIG. 7 shows an exemplary embodiment of two smart matching networks operating together to support transmit and receive functions.

FIG. 7 shows an exemplary embodiment of the smart matching network 104(d) used in conjunction with the smart matching network 110(d). The smart matching network 110(d) comprises match A1 circuit 702 and match B1 circuit 704. The match A1 circuit 702 is connected between the output of the LNA 106(d) and the node 706 connecting to the phase shifter 112(d). The match B1 circuit is connected between the input of the PA 108(d) and the node 706 connecting to the phase shifter 112(d). As described below, the smart matching network 110(d) operates similarly to the smart matching network 104(d) to save area, provide bidirectional operation, and eliminate the need for switches, thereby avoiding the associated insertion loss.

Figure 8:
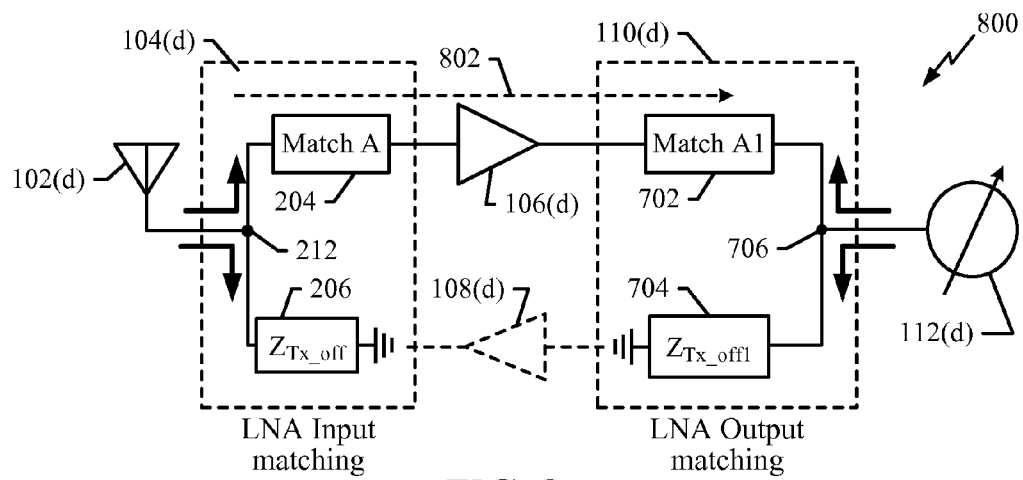
FIG. 8 shows an exemplary embodiment of two smart matching during receive mode operation.

FIG. 8 shows an exemplary embodiment of the smart matching networks 104(d) and 110(d) during receive mode operation. As discussed above, during the receive mode operation indicated by signal flow path 802, the match B circuit 206 operates to combine with the off-state output impedance of the PA 108(d) to translate this impedance to generate a second translated off-state impedance indicated by $Z_{Tx\_off}$. Similarly, the match B1 circuit 704 combines with the off-state input impedance of the PA 108(d) to translate this impedance to generate a third translated off-state input impedance indicated by $Z_{Tx\_off1}$. The impedance $Z_{Tx\_off1}$ operates to reduce the loss of signals flowing through the signal flow path 802. The impedance $Z_{Tx\_off1}$ combines with a fourth translated on-state impedance provided at the output of the match A1 circuit 702 to provide a desired matching impedance to the phase shifter 112(d) as seen at the node 706.

Figure 9:
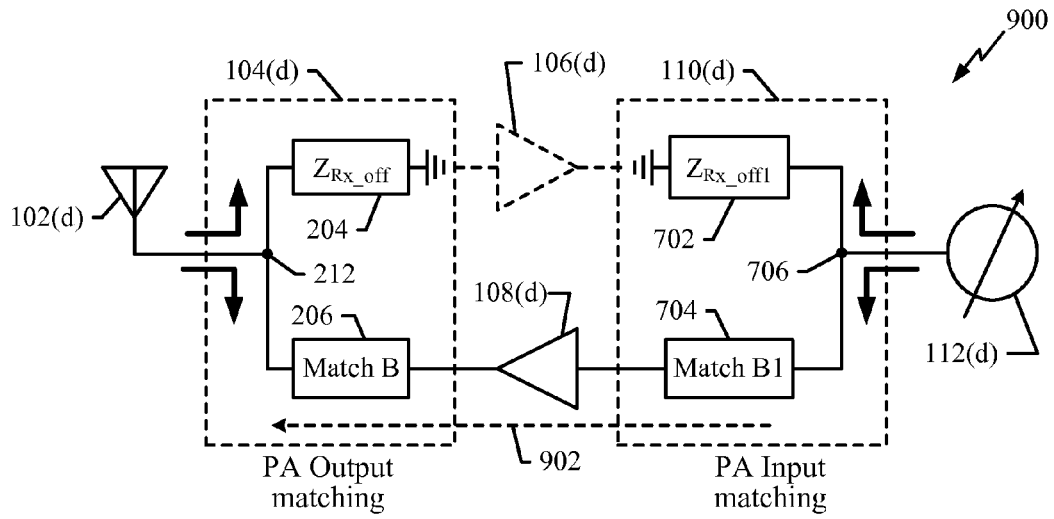
FIG. 9 shows an exemplary embodiment of two smart matching during transmit mode operation.

FIG. 9 shows an exemplary embodiment of the smart matching networks 104(d) and 110(d) during transmit mode operation. As discussed above, during the transmit mode operation indicated by signal flow path 902, the match A circuit 206 operates to combine with the off-state input impedance of the LNA 106(d) to translate this impedance to the first translated off-state impedance indicated by $Z_{Rx\_off}$. Similarly, the match A1 circuit 702 combines with the off-state output impedance of the LNA 106(d) to translate this impedance to generate a fourth translated off-state impedance indicated by $Z_{Rx\_off1}$. The impedance $Z_{Rx\_off1}$ operates to reduce the loss of signals flowing thought the signal flow path 902. Therefore, the smart matching network 110(d) effectively acts to couple the phase shifter 112(d) to the LNA 106(d) and the PA 108(d) while saving area, providing bidirectional operation, and eliminating the need for switches, thereby avoiding the associated insertion loss.

Figure 10:
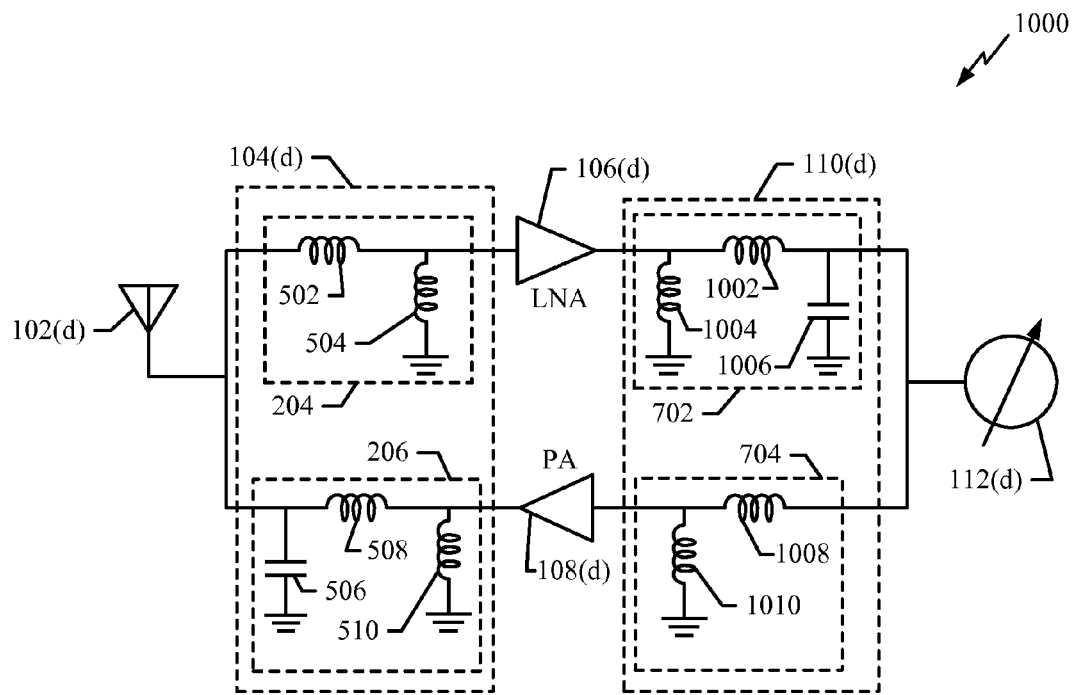
FIG. 10 shows an exemplary embodiment of two smart matching networks.

FIG. 10 shows an exemplary embodiment of the smart matching networks 104(d) and 110(d). In an exemplary embodiment, the match A circuit 204 is a mirror image of the match B1 circuit 704, and the match B circuit 206 is a mirror image of the match A1 circuit 702. It should be noted that the circuit components of the matching circuits 204, 206, 702 and 704 can be rearranged, modified, changed or otherwise adjusted based on the off-state input and off-state output impedances of the LNA 106(d) and the PA 108(d) to achieve the desired reduction in signal loss as described herein.

It should also be noted that the above descriptions equally apply to the smart matching network 116 shown in FIG. 1, which functions to match the mixers 118, 120 to the power divider/combiner 114. In this case, the LNA 106(d) and the PA 108(d) are replaced with the mixers 118 and 120. However, the analysis and implementations as described above remain the same.

Figure 11:
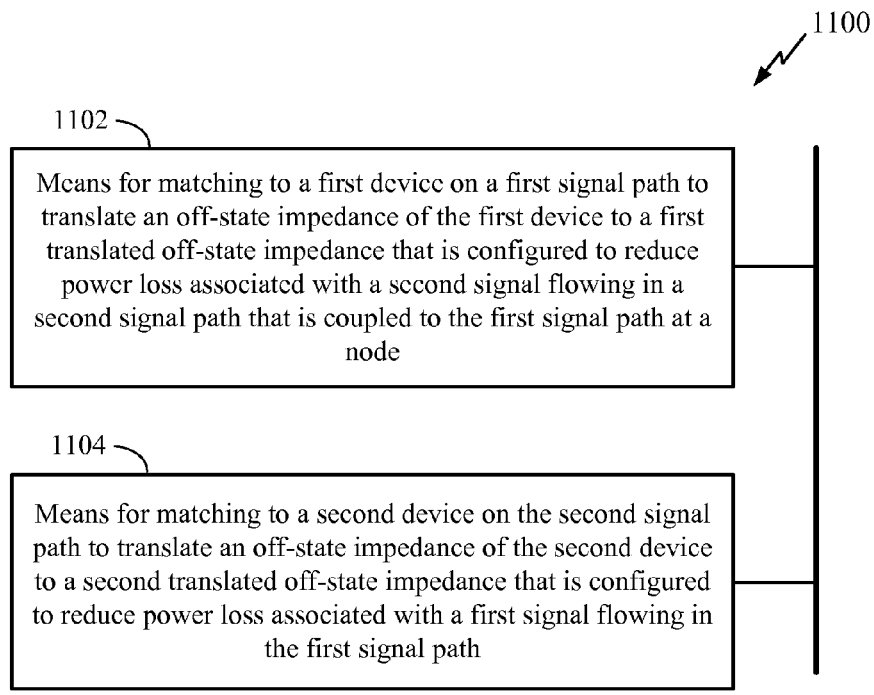
FIG. 11 shows an exemplary embodiment of a matching network apparatus.

FIG. 11 shows an exemplary embodiment of a matching network apparatus 1100. For example, the apparatus 1100 is suitable for use as any of the networks 104, 110, or 116 shown in FIG. 1. In an aspect, the apparatus 1100 is implemented by one or more modules configured to provide the functions as described herein. For example, in an aspect, each module comprises hardware and/or hardware executing software.

The apparatus 1100 comprises a first module comprising means (1102) for matching to a first device on a first signal path to translate an off-state impedance of the first device to a first translated off-state impedance that is configured to reduce power loss associated with a second signal flowing in a second signal path that is coupled to the first signal path at a node. In an aspect, the means for matching to the first amplifier comprises the match A circuit 204.

The apparatus 1100 also comprises a second module comprising means (1104) for matching to a second device on the second signal path to translate an off-state impedance of the second device to a second translated off-state impedance that is configured to reduce power loss associated with a first signal flowing in the first signal path. In an aspect, the means for matching to the second amplifier comprises the match B circuit 206.

Those of skill in the art would understand that information and signals may be represented or processed using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. It is further noted that transistor types and technologies may be substituted, rearranged or otherwise modified to achieve the same results. For example, circuits shown utilizing PMOS transistors may be modified to use NMOS transistors and vice versa. Thus, the amplifiers disclosed herein may be realized using a variety of transistor types and technologies and are not limited to those transistor types and technologies illustrated in the Drawings. For example, transistors types such as BJT, GaAs, MOSFET or any other transistor technology may be used.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both non-transitory computer storage media and communication media including any medium that facilitates transfer of a computer program from one place to another. A non-transitory storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The description of the disclosed exemplary embodiments is provided to enable any person skilled in the art to make or use the invention. Various modifications to these exemplary embodiments will be readily apparent to those skilled in the art, and the generic principles defined herein may be applied to other embodiments without departing from the spirit or scope of the invention. Thus, the invention is not intended to be limited to the exemplary embodiments shown herein but is to be accorded the widest scope consistent with the principles and novel features disclosed herein.

What is claimed is:

1. An apparatus comprising:
a first matching circuit having an input connected to a node and an output connected to an input of a first amplifier, the first matching circuit translates on-state and off-state impedances of the first amplifier to first translated on-state and off-state impedances at the input of the first matching circuit;
a second matching circuit having an output connected to the node and an input connected to an output of a second amplifier, the second matching circuit translates on-state and off-state impedances of the second amplifier to second translated on-state and off-state impedances at the output of the second matching circuit;
the second translated off-state impedance configured to reduce power loss associated with a first signal flowing in a first signal path between the node and the input of the first matching circuit; and
the first translated off-state impedance configured to reduce power loss associated with a second signal flowing in a second signal path between the output of the first matching circuit and the node.

2. The apparatus of claim 1, first translated on-state impedance combines with the second translated off-state impedance to form a first matching impedance at the node.

3. The apparatus of claim 2, the second translated on-state impedance combines with the first translated off-state impedance to form a second matching impedance at the node.

4. The apparatus of claim 3, the first and second matching impedances are substantially equal to 50 ohms.

5. The apparatus of claim 1, the first and second signals comprise receive and transmit signals, respectively, that have substantially identical frequencies.

6. The apparatus of claim 1, the first matching circuit comprising a first inductor connected between the node and the input of the first amplifier and a second inductor connected between the input of the first amplifier and a signal ground.

7. The apparatus of claim 1, the second matching circuit comprising a first inductor connected between the node and the output of the second amplifier, a second inductor connected between the output of the second amplifier and a signal ground, and a capacitor connected between the node and the signal ground.

8. The apparatus of claim 1, the first amplifier comprising a low noise amplifier (LNA).

9. The apparatus of claim 1, the second amplifier comprising a power amplifier (PA).

10. The apparatus of claim 1, the apparatus configured for use in a transceiver to couple an antenna to the first and second amplifiers using the node.

11. The apparatus of claim 1, the apparatus configured for use in a transceiver to couple the first and second amplifiers to a phase shifter.

12. The apparatus of claim 1, the apparatus configured for use in a transceiver to couple a power divider/combiner to first and second mixers.

13. The apparatus of claim 1, the apparatus configured to provide switchless concurrent matching to an antenna coupled to the node to receive and transmit signals at millimeter wave frequencies.

14. An apparatus comprising:
  means for input matching having an input connected to a node and an output connected to a signal input of a first amplifier, the means for input matching translates an off-state impedance of the first amplifier to a first translated off-state impedance at the input;
  means for output matching having an output connected to the node and an input connected to a signal output of a second amplifier, the means for output matching translates an off-state impedance of the second amplifier to a second translated off-state impedance at the output;
  the second translated off-state impedance configured to reduce power loss associated with a first signal flowing in a first signal path between the node and the input of the means for input matching; and
  the first translated off-state impedance configured to reduce power loss associated with a second signal flowing in a second signal path between the output of the means for output matching and the node.

15. The apparatus of claim 14, the means for input matching further configured to translate an on-state impedance of the first amplifier to a first translated on-state impedance that combines with the second translated off-state impedance to form a first matching impedance at the node.

16. The apparatus of claim 15, the means for output matching further configured to translate an on-state impedance of the second amplifier to a second translated on-state impedance that combines with the first translated off-state impedance to form a second matching impedance at the node.

17. The apparatus of claim 16, the first and second matching impedances matched to 50 ohms.

18. The apparatus of claim 14, the first and second signals have substantially identical frequencies.

19. The apparatus of claim 14, the first amplifier comprises a low noise amplifier (LNA), the second amplifier comprises a power amplifier (PA), and the apparatus is further configured for use in a transceiver to couple an antenna to the LNA and PA using the node.

20. The apparatus of claim 19, the apparatus configured to provide switchless concurrent matching to the antenna to receive and transmit signals at millimeter wave frequencies.

* * * * *